United States Patent [19]
Custer et al.

[11] Patent Number: 6,081,160
[45] Date of Patent: Jun. 27, 2000

[54] METHOD AND APPARATUS FOR INCREASING THE BANDWIDTH, AND REDUCING THE SIZE, OF THE DC FEED NETWORK FOR WIDEBAND RF AMPLIFIERS USING SELECTIVE PLACEMENT OF HIGH DIELECTRIC CONSTANT MATERIAL

[75] Inventors: James Keith Custer, Fair Oaks; Charles M. Keen, Cameron Park; William Kerr Veitschegger, Folsom, all of Calif.

[73] Assignee: Powerwave Technologies, Inc., Irvine, Calif.

[21] Appl. No.: 09/082,651

[22] Filed: May 20, 1998

[51] Int. Cl.⁷ ........................................................ H03F 3/60
[52] U.S. Cl. ............................ 330/286; 330/66; 330/302
[58] Field of Search ................................. 330/65, 66, 67, 330/68, 286, 296, 302; 361/762

[56] References Cited

U.S. PATENT DOCUMENTS

| | | | |
|---|---|---|---|
| 4,864,250 | 9/1989 | Bacon | 330/296 X |
| 5,270,667 | 12/1993 | Upton | 330/296 X |
| 5,272,450 | 12/1993 | Wisherd | 330/297 |
| 5,592,122 | 1/1997 | Masahiro et al. | 330/302 X |
| 5,847,608 | 12/1998 | Maruhashi | 330/286 X |
| 5,914,641 | 6/1999 | Yun et al. | 330/302 |

OTHER PUBLICATIONS

Transmission–Line Theory by Peter A. Rizzi, Microwave Engineering Passive Circuits, by Prentice–Hall, Inc. 1998, (pp. 90–91).

*Primary Examiner*—Steven J. Mottola
*Attorney, Agent, or Firm*—Graham & James LLP

[57] ABSTRACT

For use with RF circuitry in which a DC bias circuit provides bias voltage is provided to impedance-matched circuitry, a structure is provided, in which a dielectric member, having a high dielectric constant, is selectively placed adjacent to a bias feed line coupled between the DC bias circuit and the remainder of the circuitry, to maintain high RF impedance while reducing impedance at lower frequencies. The invention has particular applicability to RF amplifiers, to be used for amplifying modulated carriers, such as video signals made up of an RF carrier and a lower-frequency modulation. Where the carrier has a predetermined wavelength, the physical length of the bias feed line and the dielectric constant of the dielectric member are chosen such that an effective length of the bias feed line is a quarter of the wavelength of the carrier.

18 Claims, 3 Drawing Sheets

Table 1

| Row | D.K. | F(MHz) | Zo | l(mil) | tan βl | \|Zin\| |
|---|---|---|---|---|---|---|
| 1 | 4.2 | 2000 | 52 | 833 | ∞ | ∞ |
| 2 | 4.2 | 20 | 52 | 833 | .0157 | .82 |
| 3 | 4.2 | 4000 | 52 | 833 | 0 | 0 |
| 4 | 21 | 2000 | 12 | 368 | ∞ | ∞ |
| 5 | 21 | 20 | 12 | 368 | .0157 | .19 |
| 6 | 21 | 4000 | 12 | 368 | 0 | 0 |

FIG. 5

Summary of Simulation Results

| CASE | $\varepsilon_T$ | H (mils) | W (mils) | L (mils) | Zo (ohms) | RE [ZI] @ 2 GHz(ohms) | RE [ZI] @ 20MHz(ohms) | IM [ZI] @ 20 MHz(ohms) |
|---|---|---|---|---|---|---|---|---|
| I | 4.1 | 28 | 100 | 748 | 34 | 1700 | .097 | .535 |
| II | 10.4 | 28 | 100 | 458.5 | 21.9 | 757 | .093 | .345 |
| III | 60 | 4 | 100 | 200.5 | 1.8 | | | |
| IV | 4.1 | 28 | 54.8 | 791.7 | 50 | 3000 | .114 | .789 |
| V | 10.4 | 28 | 24.3 | 538.5 | 50 | 2800 | .124 | .788 |
| VI | 21 | 10 | 80 | 246.3 | 8.2 | 129.6 | .093 | .134 |
| VII | 21 | 10 | 100 | 224.7 | 6.8 | 99.7 | .091 | .113 |

FIG. 6

METHOD AND APPARATUS FOR INCREASING THE BANDWIDTH, AND REDUCING THE SIZE, OF THE DC FEED NETWORK FOR WIDEBAND RF AMPLIFIERS USING SELECTIVE PLACEMENT OF HIGH DIELECTRIC CONSTANT MATERIAL

FIELD OF THE INVENTION

The invention generally relates to the field of RF power amplifiers. More specifically, the invention relates to DC voltage feed networks for RF power amplifiers.

BACKGROUND OF THE INVENTION

Radiofrequency (RF) amplifiers are commonly used in numerous applications, such as video systems. Video signals which may be amplified by an RF amplifier have frequency characteristics, in which they include an RF (high-frequency) carrier, typically having a fundamental frequency of around 2 gigahertz (GHz), and a somewhat lower frequency component which modulates the carrier. This signal component is called the video signal. Depending on the application, the video bandwidth can be anything from 30 kilohertz (KHz), such as for cellular telephones, to 20 megahertz (MHZ), such as for W-CDMA applications. RF bandwidth generally includes the fundamental frequency and a first harmonic, double the frequency of the fundamental.

A Conventional RF Amplifier Architecture

A common-high-level architecture for an RF amplifier is shown in FIG. 1. For the sake of the present discussion, the conventional amplifier is depicted generally, or schematically, as an operational amplifier. However, it will be understood that the points made in connection with FIG. 1 have general applicability to RF amplifiers, regardless of their particular design.

An input signal 2, such as the video signal just described, is to be amplified. The elements of the RF amplifier will be explained below, in connection with a discussion of the characteristics of the RF amplifier. Typically, the RF amplifier is built using a printed circuit (PC) board, with the components installed on the board.

In general, desirable characteristics for amplifier circuits include linearity and impedances which have well-defined values.

Linearity is important because, the more linear the characteristic of the amplifier, the less signal distortion is introduced as a consequence of the amplification. Linearity is measured over a band of frequencies. In RF amplifiers, for instance, it is desirable that the linearity cover a band including both the carrier and the video signal.

There are techniques, well known in the field of amplifier design, for giving amplifiers linear characteristics. For instance, negative feedback, from the output of an active element back to an input, works well to produce linear characteristics. The amplifier circuit of FIG. 1 uses a differential-input operational amplifier (op-amp) element 4 as the active element. A negative feedback coupling 6 is provided between the output and the negative input of the op-amp 4.

Persons skilled in the art of amplifier design will be familiar with numerous alternative designs and components which may serve as the active element. A power transistor, for instance, may be used.

The impedance of a circuit, or of a circuit element, can have profound effects on the suitability of a circuit for its purpose.

High input impedance, for instance, is desirable because the input of the amplifier is coupled to a signal source which itself has an output impedance. The output impedance of the source, and the input impedance of the amplifier, form a voltage divider, in which the signal is dropped over the two impedances in proportion to their impedance values.

For maximum power transfer, i.e., to get the greatest amount of the signal into the amplifier, the amplifier's real input impedance $R_L$ must be equal to the real output impedance $R_S$ of the source. Therefore, amplifier designers strive to make the input impedance equal the source impedance.

Conversely, there are circuit elements for which the impedance should be low, or which should vary with frequency in specified ways. As will be discussed in detail below, certain components within RF amplifier circuits require impedances with specific values, which vary for different frequencies.

In particular, to avoid perturbations in the DC caused by the signal, the impedance at the video frequency should be carefully controlled.

For LDMOS circuit technology, low impedance on the drain DC feed is critical. For bipolar circuit technology, low impedance is critical for both base and collector feeds.

It is also common practice in amplifier design to provide a direct current (DC) bias voltage. The signal to be amplified is then treated as a perturbation above and below that bias voltage. Where the bias voltage is positioned near the middle of a voltage range of linear operation, good, low-distortion amplification is produced. Accordingly, FIG. 1 shows a bias circuit 8 coupled to the output of the op-amp 4 through a bias feed line 9.

Another issue relating to RF amplifier design stems from the relative physical dimensions of the circuit elements and connections, versus the wavelengths of the RF signals to be amplified. Because of the high frequency (and, consequently, the short wavelength) of the RF signals, there may be a significant phase difference in the signal between the ends of the bias feed 9. Circuit designers deal with this phase difference through the well-known theory of transmission lines.

An important issue in transmission line theory is that of impedance matching. Where there is an impedance mismatch between a signal source and a signal destination, the signal may be reflected back along the transmission line connection toward the source. This reflection leads to undesirable signal reflection loss. Impedance matching is employed to eliminate this undesirable reflection. Accordingly, in FIG. 1, an impedance matching circuit, shown schematically as 10, is provided between the output of the op-amp 4 and the output 12 of the overall RF amplifier circuit.

Therefore, a conventional RF amplifier will have the general architecture given in FIG. 1, generally having the active element 4, the bias 8, and the impedance matcher 10.

The Problem of Reconciling Bias Circuit Impedance Requirements

In RF amplifiers such as that of FIG. 1, there are two requirements, which tend to conflict with each other.

One requirement is that the bias circuit 8 should have a low impedance at the frequency of the signal modulation. That impedance is referred to as the video impedance. By keeping the video impedance low, linearity is maintained and distortion of the video signal is minimized.

The other requirement is that, at the RF carrier frequency, the bias circuit 8 should have a high impedance, to prevent loading of the matching circuit 10. The impedance of the bias circuit 8 should preferably be at least an order of magnitude higher than the impedance at the connection points.

It is possible to design RF amplifier circuits, and to configure their physical implementations, such that impedance is a function of the frequency of the signal in question. Thus, a suitably designed RF amplifier can have two different impedance values in the carrier frequency range and the video signal frequency range.

However, in general such circuit design becomes more difficult as bandwidth requirements, i.e., linearity requirements across bands, become greater, and as bands which have different requirements get closer together across the frequency spectrum. This problem has become increasingly difficult, because new technologies have caused the video bandwidth requirements to increase. For instance, while FM cellular technology has called for a video bandwidth of 30 kHz, newer W-CDMA applications require a video bandwidth of 20 MHZ Additionally, physical implementations, such as implementations on printed circuit boards, impose cost and space requirements which further limit the designers flexibility for achieving RF amplifiers of a given output power and linearity.

Prior Art Solutions

With the foregoing issues and criteria in mind, amplifier designers have tried several approaches to produce DC bias circuits so as to achieve the desired objectives.

1. Quarter-Wavelength Transmission Line

The most common bias circuit design, generally used in PC board implementations is to print a transmission line between the bias circuit 8 and the junction between the active element 4 and the matching network 10. The transmission line has high characteristic impedance compared to the matching network 10, and has a length which is a quarter wavelength of the RF carrier. At the end of the transmission line, a low RF and DC impedance is established, using filter capacitors.

This design has two drawbacks. First, the length of the transmission line is great enough to take up an undesirably large amount of PC board real estate. Second, it has been found that the impedance at 20 MHZ, resulting from the length of the transmission line tends to be too high for good linearity.

2. Discrete Inductor

Another design includes a discrete inductor, positioned between the bias circuit 8 and the matching circuit 10. This design also has the drawback that PC board real estate is taken up, this time by the inductor. Also, it has been found that, while the RF impedance is suitably high, the video impedance, around 20 MHZ, is undesirably high.

3. Parallel Tank Circuit (U.S. Pat. No. 5,272,450)

Yet another conventional design is given in Wisherd, U.S. Pat. No. 5,272,450, "DC Feed Network for Wideband RF Power Amplifier." In Wisherd, the DC bias circuit is coupled through a parallel tank circuit.

A capacitor is included, for resonating out the inductive loading at RF, thereby allowing a lower value inductor to be used. The lower value inductor is smaller, and takes up less board real estate. Also, the lower inductance value provides lower impedance at the video frequency.

However, this design also has several drawbacks. The two discrete components (the inductor and the capacitor) may introduce undesirable parasitic loading effects on the matching circuit. Also, lowering the inductance degrades the RF bandwidth and the circuit's Q increases. (Q is a numerical measure of the circuit's bandwidth. The value of Q increases as the bandwidth decreases.)

4. Shortening the Bias Feed

By contrast with the first conventional technique, the bias feed can be made shorter than a quarter wavelength. This technique reduces the video impedance, but has several drawbacks. First, the RF impedance at the fundamental frequency is also reduced. Additionally, the RF impedance varies rapidly over the RF bandwidth (e.g., between the 2 GHz fundamental and the 4 GHz first harmonic). In particular, the impedance at the second harmonic tends to be undesirably high.

Therefore, there is an unmet need for an approach to RF amplifier design which achieves the desired circuit characteristics given above, and which avoids consuming unnecessarily large amounts of PC board real estate.

SUMMARY OF THE INVENTION

It is therefore an object of the invention to provide an RF amplifier design which provides the desirable characteristics described above.

To achieve this and other objects, there is provided, in accordance with the invention, an RF circuit (for instance, an RF amplifier).

The RF circuit comprises an active element having an output; an impedance matching network coupled to the output of the active element at a junction; and a DC bias circuit. A bias feed line is coupled between the DC bias circuit and the junction.

In accordance with the invention, a dielectric member is disposed in proximity to the bias feed line so as to provide for electric field coupling with the bias feed line. As a consequence, high impedance is maintained at a first frequency band (the carrier frequency band), while low impedance is produced at a second frequency band (the video frequency band).

The effective length of the of the feed line, ideally one-quarter wavelength, is determined both by the actual length of the feed line and by the electrical coupling with nearby dielectric materials. A printed circuit board is generally made of a dielectric material having a relatively low dielectric constant. Thus, the electric coupling between the feed line and the printed circuit board has only a modest effect on the feed line's effective length. In accordance with the invention, however, a high-dielectric-constant material, disposed adjacent to the feed line, provides an advantageously great reduction in the actual length of the feed line.

In general, the high-dielectric-constant material will be expensive, relative to the cost of printed circuit board material. Therefore, further in accordance with the invention, a member, made of the high-dielectric-constant material, is positioned adjacent to the feed line for optimum electrical coupling. Further, the size (i.e., physical dimensions) of the member is only as great as is required to provide the coupling. In general, the size of the member is related to the dimensions of the layout of the feed line on the printed circuit board.

In implementations where the RF circuit is implemented as a PC board, the bias feed line includes a conductive trace on the PC board, and the dielectric member is physically disposed on the PC board above the bias feed line.

Optionally, the dielectric member can be a capacitor, such as a surface mount capacitor. Also optionally, the dielectric member can be grounded, or electrically coupled to a DC voltage, which serves as an AC ground. The dielectric member may or may not be electrically connected to the bias feed line. Where there is such an electrical connection, the dielectric member interacts with the bias feed line by electric field coupling, and also serves a dual purpose because of the electrical connection. What that dual purpose is may vary, depending on the particular circuit design, and its purpose.

The description which follows will show that the invention produces advantageously reduced impedance at the video band, without the drawback of reducing the impedance at the carrier frequency. Additionally, only a modest cost is incurred for the dielectric member selectively placed adjacent to the bias feed line.

BRIEF DESCRIPTION OF THE DRAWINGS

FIG. 5 is a table giving comparative characteristics and performance for a conventional RF amplifier and an RF amplifier according to the invention.

FIG. 6 is a table of definitions and results for a set of simulations of RF amplifiers according to the invention.

DETAILED DESCRIPTION OF THE PREFERRED EMBODIMENTS

Figure 1:
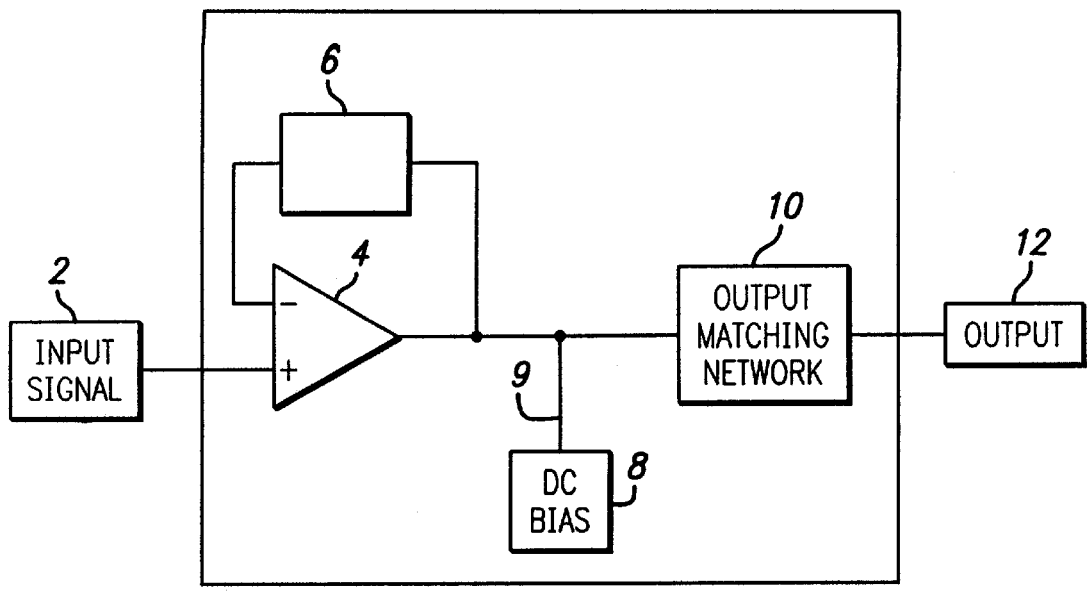
FIG. 1 is a high-level schematic drawing of a conventional RF amplifier.
Figure 2:
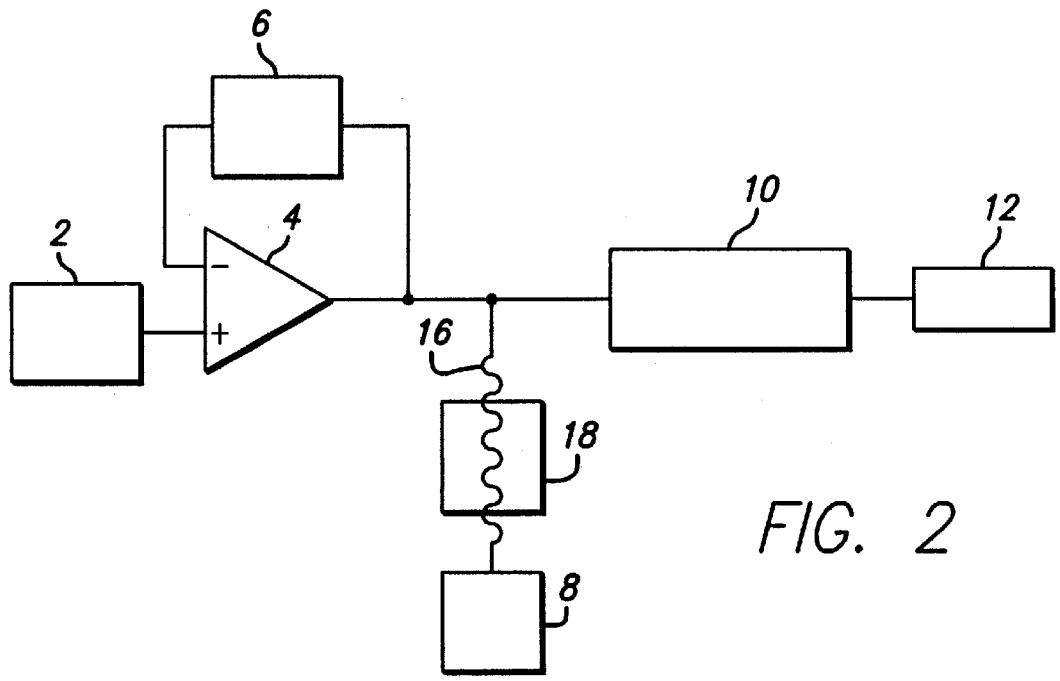
FIG. 2 is a high-level schematic diagram of an RF amplifier according to the invention.

FIG. 2 is a high-level schematic diagram, similar to that of FIG. 1, but incorporating a selectively placed dielectric member in accordance with the invention. Components which appeared in FIG. 1 are numbered correspondingly. In addition, a junction between the active element 4 and the matching network 10 is shown as 14. The DC bias network 8 is coupled to the junction 14 through a bias feed 16. Since, at radiofrequencies the bias feed 16 exhibits transmission line characteristics, the term "transmission line 16" will be used synonymously.

In accordance with the invention, a dielectric member 18 is disposed adjacent to the transmission line 16, so as to interact capacitively with the transmission line 16.

The physical dimensions of the dielectric member 18, and its particular dielectric constant, are chosen, in cooperation with the physical length of the transmission line 16, so as to achieve the desired effective transmission line length. In general, the dielectric member 18 should cover as much of the transmission line 16 as practicable.

In a first preferred embodiment, the dielectric member 18 is not electrically coupled to the transmission line 16 in a fashion which would be represented, on a schematic diagram, as a direct connection. Rather, electric field coupling takes place. However, in accordance with the invention, there may be situations in which, for reasons determined by the circuit designer, the dielectric member may be electrically connected to the bias feed line, or to other parts of the RF circuit, to provide a "dual function." Such alternatives also fall within the spirit and scope of the invention.

Figure 3:
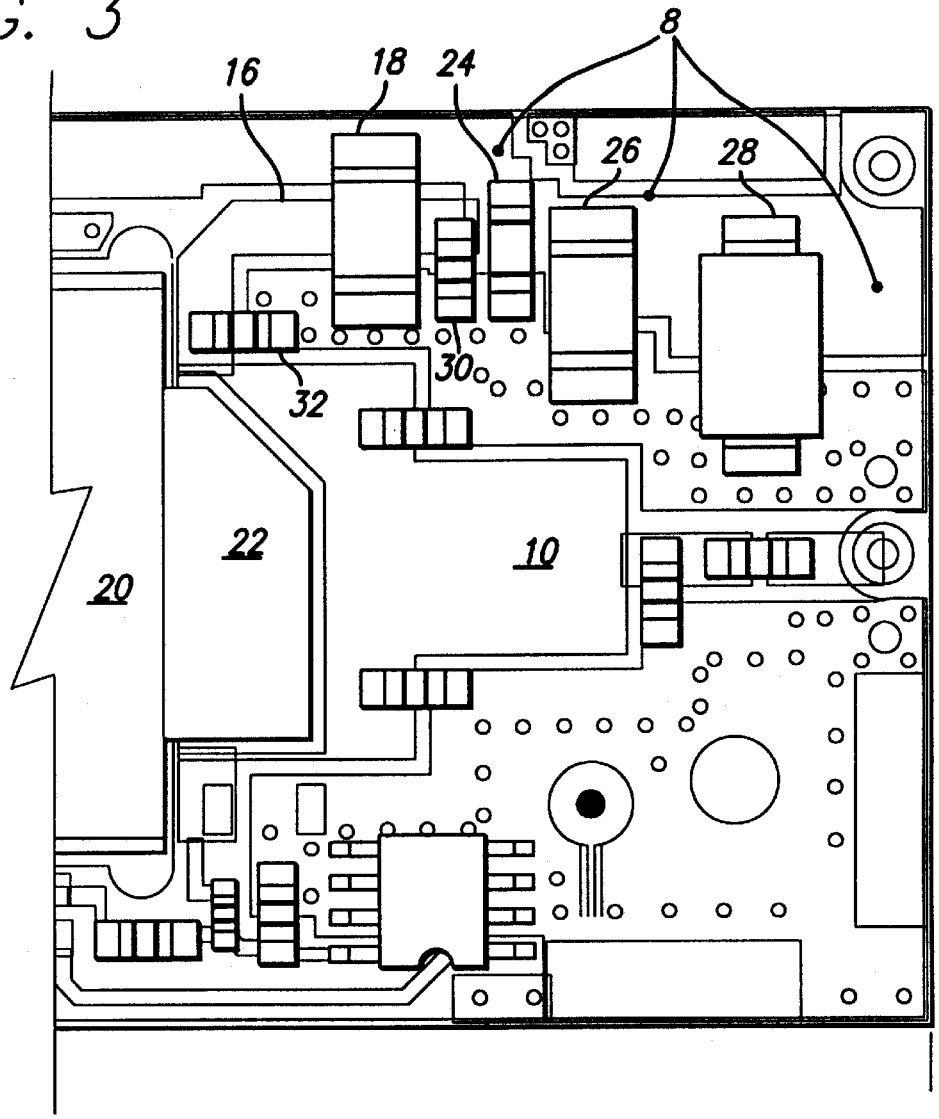
FIG. 3 is a diagram of a printed circuit board layout for an RF amplifier according to the invention.

FIG. 3—A Realistic Printed Circuit Layout

FIG. 3 is a diagram showing a portion of a PC board layout of an example of an RF amplifier. Both copper traces and superimposed components are shown. The PC board is a realistic illustration of an implementation of an RF amplifier according to the invention. As such, numerous structures not directly related to the subject matter of the invention are shown. Only those copper traces or components directly related to the invention will be pointed out and discussed.

The RF amplifier of FIG. 3, corresponds, in terms of essential elements, to that of the schematic diagram of FIG. 2. For convenient reference, corresponding components will again be numbered correspondingly.

The active element 4 is implemented as a power transistor, shown as having a transistor body 20 and a collector trace 22. As per commonly employed circuit design principles, the collector trace 22 serves as the active element output.

The impedance matching network 10 is shown generally in the middle part of the PC layout. The collector trace 22 is electrically coupled to the matching network 10 at a junction therebetween. Implementation details not essential to the invention will be omitted from this discussion.

Figure 4:
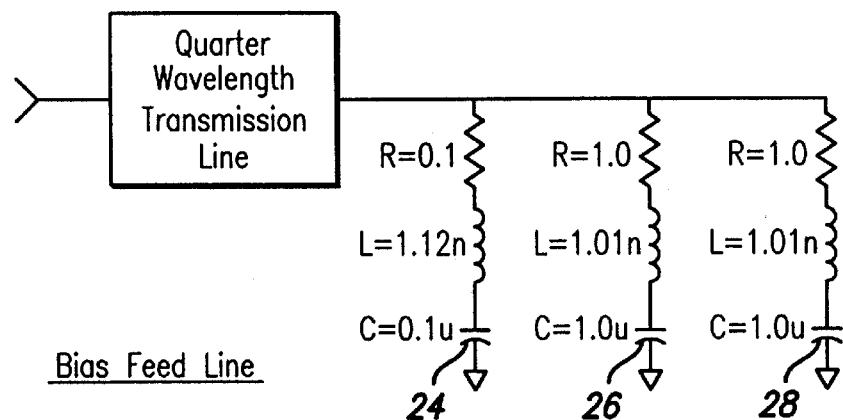
FIG. 4 is a schematic diagram of a DC bias circuit employed in an RF amplifier according to the invention.

The DC bias network 8 may be better understood with reference to FIG. 4, a schematic diagram. The bias circuit 8 shows three tank circuits in parallel with each other. These three tank circuits actually represent parasitic elements of bypass capacitors. The bypass capacitors themselves (24, 26, and 28, respectively) have values which are chosen for a low video impedance. Implementation details not essential to the invention, such as the linearization circuitry, will be omitted from this discussion. The three capacitors 24, 26, and 28 are visible as components on the PC layout of FIG. 3.

An RF shorting capacitor 30 is electrically coupled to the ends of the bias feed 16. The RF shorting capacitor 30 provides a low impedance at the RF carrier frequency, to minimize RF loss.

In FIG. 4, the bias feed transmission line 16 is shown schematically as a rectangular box element, labeled "Quarter Wavelength Transmission Line." In a realistic implementation on a PC board, the transmission line 16 will have an overall shape and layout determined by the design criteria and issues applicable for the particular circuit being implemented. The dielectric member 18, not shown in FIG. 4, would be superimposed over the transmission line 16.

In realistic PC layouts, it may be possible to envision a fairly regular or convex "envelope," such as a substantially rectangular envelope, within which substantially all of the transmission line 16 is laid. In such cases, the dielectric member 18 is preferably a similarly regular or convex (e.g., rectangular) shape, and is positioned over the transmission line 16.

The transmission line 16 is shown in FIG. 3 as a roughly L-shaped, corner-beveled region of copper on the PC board. The lower left end of the L-shaped bias feed 16 is coupled to the junction between the collector trace 22 and the impedance matching network 10. The upper right end of the bias feed 16 is shown as adjacent to the capacitor 24 of the bias feed 8, and is electrically coupled to the bias feed 8.

In accordance with the invention, the dielectric member 18 is disposed adjacent to the bias feed 16. The dielectric member 18 is shown as a rectangularly-shaped piece of dielectric material positioned over the transmission line 16. In this particular example, the dielectric member 18 is shown as a surface mount capacitor. However, other types of capacitors, or other forms of dielectric members, may also be used.

In the example of FIG. 3, the rectangularly-shaped surface mount capacitor covers only a portion of the transmission line 16. In this example, however, the relative shapes of the transmission line 16 and the dielectric member 16, and their positions relative to each other, are sufficient to bring about the desired shortening of the effective electrical length of the transmission line 16 to a quarter wavelength.

The particular circuit from which the diagram of FIG. 3 was taken is an example of a circuit in which the dielectric member 18 is electrically connected to the circuit, as well as being positioned for electric field coupling.

Preferably, the dielectric member is made of a high dielectric constant material. For instance, an NPO ceramic capacitor has a dielectric constant of about 21.

Preferably, the dielectric member 18 also includes an outer skin or layer which is insulating, but through which electric fields can pass. For instance, the dielectric member 18 can include a chip capacitor having a plate-dielectric material-plate "sandwich" and a wrapper around the sandwich.

In accordance with the invention, there is no direct electrical connection between the dielectric member 18 and the transmission line 16, such as would appear on a schematic circuit diagram. However, there may be an electrical connection between the dielectric member 18 and other electrical circuitry. For instance, the dielectric member 18 (that is, the surface mount capacitor) may be grounded, or otherwise connected to a DC voltage, which serves as an AC ground.

Electric field coupling takes place between the bias feed 16 and the dielectric member 18. As a consequence, the desirable properties referred to in the Background are achieved in a way not provided by prior art structures.

In a conventional PC layout, in which the dielectric member 18 were omitted, electric field coupling would take place between the bias feed 16 and planes or traces nearby. The planes or traces could be either ground potential or D.C. power supply voltages, the latter being, effectively, A.C. grounds. Electric field coupling occurs laterally edge-on from the bias feed 16 to the planes or traces, across gaps that might typically be about 30 mils wide. Most of this coupling occurs from a microstrip effect of the DC bias feed line and a ground plane underneath it, with a layer of low-dielectric-constant printed circuit board material in between.

In accordance with the invention, however, where the dielectric member 18 is disposed over the bias feed 16, electric field coupling takes place face-to-face, rather than laterally edge-on. Accordingly, there is greater coupling that would occur with the conventional structure.

Further, the gap between the dielectric member 18 and the bias feed 16 is smaller, preferably 4 to 10 mils, because of the outer layer around the dielectric member 16. Again, the smaller gap allows for greater field coupling, and for better achievement of the objectives described above.

Other embodiments of the invention may be made, by varying the size and shape of the dielectric member 16, by doing so cooperatively with variations in the layout of the bias feed 16, by varying the composition of the dielectric member 18 to vary its dielectric constant, and by other techniques that will be known to persons skilled in the art of RF circuit design.

Operation of the Invention

The discussion which follows will explain, in somewhat more technical detail, the operation of the invention. A direct comparison of a conventional RF amplifier with an RF amplifier according to the invention is given, with reference to the table of FIG. 5.

As discussed above, the task at hand is to provide a bias feed such that, overall, its impedance Z is large across the RF bandwidth, but low over the video bandwidth, i.e., low up to the maximum video frequency. As per transmission line theory, the impedance Z is given by the expression $$Z = jZ_0 \tan(\beta l)$$

where j again is the square root of −1. That is, the impedance Z has only an "imaginary" component. However, the impedance Z's magnitude |Z|, given by the expression $$|Z| = Z_0 \tan(\beta l)$$

is readily obtained.

$Z_0$ is a characteristic impedance of the transmission line 16, and $\beta = 2\pi/\lambda$, where $\lambda$ is an effective wavelength for the dielectric material. The effective wavelength $\lambda$ of a material is inversely related to the dielectric material's dielectric coefficient.

The table of FIG. 5 shows results for two situations. In the conventional situation (lines 1–3 of the table), there is no dielectric member 18. however, the PC board is made of a material having a dielectric coefficient of a relatively low value, typically 4.2. There will be some capacitive interaction between the bias feed 16 and the PC board material. However, it will be seen that, absent the invention, the capacitive interaction is not great enough to produce a desirable result.

In the situation according to the invention (lines 4–6 of the table), the dielectric member 18 is present, and its dielectric coefficient has a suitably high value, in this example a value of 21.

The table of FIG. 5 gives example values for conventional and inventive RF amplifiers. Values will be obtained at three frequencies, (i) a typical maximum video frequency of 20 MHZ, a typical fundamental carrier frequency of 2 GHz, and the corresponding first harmonic of the carrier, at 4 GHz.

In both cases, the bias feed 16 is a transmission line 50 mils wide and a quarter-wavelength in length. However, because of the different dielectric material (the PC board material for the conventional case, the dielectric member 18 for the invention), the invention has a shorter transmission line 16, corresponding with the shorter effective wavelength $\lambda$ of the dielectric member 18. The lengths are 833 and 368 mils, respectively, for the conventional and inventive transmission lines 16.

Also, the characteristic impedance of the transmission line 16 changes accordingly, from 52 Ω in the conventional case to 12 Ω for the invention.

The second-last column of the table of FIG. 5 gives the expression $\tan(\beta l)$, which occurs in the impedance expression given above. Since the product $\beta l$ includes the ratio of the transmission line 16's length l and the dielectric member 18's effective wavelength $\lambda$, both of which varied correspondingly, it will not be surprising that the three values of $\tan(\beta l)$ match for the conventional and inventive cases.

However, the advantageous results achieved in accordance with the invention may be observed from the last column, second and fifth lines (i.e., the conventional and inventive cases). The impedance $Z_{in}$ at the video frequency, 20 MHZ, which should be as small as possible, has dropped from 0.82 Ω to 0.19 Ω through the addition of the dielectric member 18, according to the invention. This is a performance improvement of a factor of 0.82/0.19=4.3.

Note, additionally, that the magnitude of the impedance $Z_{in}$ is infinity at the fundamental carrier frequency (where it should desirably be as great as possible), and zero at the first harmonic (also desirable). This is true for both the conventional and inventive cases, so there is no performance degradation.

Simulations of RF Amplifiers According to the Invention

A set of simulations have been performed to demonstrate the performance of RF amplifiers according to the invention. In the simulations, the values of various parameters have been varied, so that results may be compared.

The simulations employed, as the active element 4, a power transistor and a three-tank-circuit impedance matcher, as described in connection with the PC layout of FIG. 3.

The parameters which vary for the different simulations are the dimensions (height, width, and length) of the quarter wavelength transmission line, and the dielectric constant $\epsilon_r$ of the dielectric member placed in physical proximity to the transmission line. The transmission line has a characteristic impedance $Z_0$, measured in ohms ($\Omega$), which is proportional to the height and width, and inversely proportional to the length.

In general, the impedance should be low at video frequencies (for instance, around 20 MHZ), high at a fundamental RF carrier frequency (for instance, around 2000 MHZ), and low at the first harmonic of the carrier frequency (twice the fundamental carrier frequency, for instance, 4000 MHZ).

FIG. 6 is a table which summarizes the results for seven simulations. The goal, again, is to design a wide video bandwidth bias feed with the lowest possible impedance.

The expression $\epsilon_r$ is the dielectric constant of the dielectric material.

The dimensions given are as follows: L is the transmission line length, and W is the transmission line width. H is the thickness of the dielectric material positioned over the transmission line.

The impedance, designated $Z_1$, is given for the fundamental carrier frequency of 2 GHz, and for a 20 MHZ reference point in the video bandwidth.

The impedance $Z_1$ is measured according to the frequency domain, and has an associated phase angle. Accordingly, impedance is mathematically a "complex" number, having a "real" part and an "imaginary" part. Where a complex value is given, it is common practice to give it in the mathematical form $$\text{<real>}+j\text{<imaginary>}$$

where j is the square root of $-1$.

In general, however, the impedance for a given simulation may be grasped by reference to the magnitudes of the real and imaginary parts. These real and imaginary magnitudes are given in the table of FIG. 4, for the various simulations. Note that magnitudes of IM[Z1] at 2 GHz are not reported. This is because the transmission line was adjusted for parallel resonance. As a consequence of that adjustment, the imaginary component of the impedance at the fundamental carrier frequency is 0.

Case I was used as a standard baseline. The dielectric material used was HT2 material having a dielectric constant of 4.1. The impedance at 2 GHz is 1700 ohms. The real and imaginary components of the impedance at 20 MHZ are 0.097 and 0.535 ohms, respectively.

In Case II, the dielectric constant er was increased to 10.4. To achieve parallel resonance, again, the transmission line was reduced in length to 458 mils. As a result of the higher dielectric constant and the shortened transmission line, its characteristic impedance $Z_0$ fell to 22 $\Omega$. The impedance $Z_1$ at 2 GHz fell to 757 $\Omega$, and the complex impedance at 20 MHZ is 0.093+j0.345 $\Omega$.

In Case II, the dielectric constant was further increased to 60. The dielectric thickness was decreased. The effective transmission line length was again decreased, causing the impedance $Z_0$ to fall to 1.8 $\Omega$. However, neither this, nor any other length that was considered, would bring about parallel resonance at 2 GHz. This was deemed an unrealistic scenario, not worth pursuing, because the transmission line characteristic impedance $Z_0$ was less than the output impedance of the power transistor active element.

In Cases IV and V, the same two dielectric constants as those of Cases I and II were used, and the transmission line dimensions were chosen to increase the constant characteristic impedance $Z_0$ to 50 $\Omega$, as well as to provide parallel resonance at 2 GHz. The impedance $Z_1$ at 2 GHz were both relatively large values, 3000 $\Omega$ and 2800 $\Omega$, respectively. The complex impedances at 20 MHZ, however, were also much higher than those for Cases I and II. (Note that, in Cases I and II, the transmission line widths were greater.)

In Cases VI and VII, a chip capacitor was used as the dielectric member. The capacitor was coupled across the transmission line. In these two simulation, the dielectric material between the plates of the capacitor was a fairly large 21, and the plates had 10 mils separation. The transmission line width was 80 and 100 mils, respectively, leading to characteristic impedances $Z_0$ of 8.2 and 6.8 $\Omega$), respectively.

The simulation produced impedances $Z_1$ at 2 GHz of 130 and 100 $\Omega$, respectively. These $Z_1$ impedances are significantly lower than those of the previous Cases, due to the lower transmission line impedances $Z_0$. They are, however, greater than the standard-rule-of-thumb values of 10 times the output impedance of the active element.

The complex impedances at 20 MHZ are also lower than those of the previous Cases, since the transmission line's width is greater, and length is shorter, than in those previous Cases.

Conclusions From the Simulations

Given the results of the simulations discussed above, some conclusions may be drawn, as to what design criteria should be used to design PC layouts such as that of FIG. 3, to produce the best results.

To keep the real part of the video impedance as low as possible, the width of the transmission line should be at least 80 mils. To keep the imaginary part low, the transmission line should be as short as possible. Keeping the transmission line short may also tend to reduce transmission line effects.

It is also possible to achieve similarly desirable video impedances by using higher dielectric materials. For a given physical length, using a high dielectric constant member reduces the characteristic impedance $Z_0$ and decreases the effective wavelength. This reduces the impedance at video frequencies while maintaining a high impedance at the RF carrier frequency. Thus, this technique achieves the desirable impedances discussed above.

What is claimed is:

1. An RF circuit on a printed circuit board comprising:
   an active element having an output;
   an impedance matching network coupled to the output of the active element at a junction;
   a DC bias circuit;
   a bias feed line coupled between the DC bias circuit and the junction, wherein the bias feed line includes a conductive trace disposed on the printed circuit board; and
   a dielectric member disposed on the printed circuit board above the bias feed line;
   wherein a high impedance of the bias feed line is maintained at a first frequency band, while a low impedance is produced at a second frequency band.

2. An RF circuit as recited in claim 1, wherein the RF circuit includes an RF amplifier.

3. An RF circuit as recited in claim 1; wherein the dielectric member is arranged to cover the bias feed line.

4. An RF circuit as recited in claim 1, wherein the dielectric member includes a capacitor.

5. An RF circuit as recited in claim 1, wherein the dielectric member is electrically coupled to an AC ground potential.

6. An RF circuit as recited in claim 1, wherein:

the RF circuit is operable on an RF signal having a carrier, the carrier having a predetermined wavelength;

the printed circuit board is made of material having a first dielectric constant;

the dielectric member is made of a material having a second dielectric constant;

the bias feed line has a physical length and an effective length, the effective length being related to the physical length and to the first and second dielectric constants; and the physical length and the first and second dielectric constants have values such that the effective length is one quarter of the predetermined wavelength of the carrier.

7. An RF circuit on a printed circuit board comprising:

an active element having an output;

an impedance matching network coupled to the output of the active element;

a DC bias circuit;

a load;

a bias feed line coupled at one end to a junction located between the active element and the load and at another end to the DC bias circuit, wherein the bias feed line includes a conductive trace disposed on the printed circuit board; and a dielectric member disposed on the printed circuit board above the bias feed line;

wherein a high impedance of the bias feed line is maintained at a first frequency band, while a low impedance is produced at a second frequency band.

8. An RF circuit on a printed circuit board comprising:

an active element having an output;

an impedance matching network coupled to the output of the active element;

a DC bias circuit;

a load;

a bias feed line coupled at one end to a junction located between the impedance matching network and the load and at another end to the DC bias circuit, wherein the bias feed line includes a conductive trace disposed on the printed circuit board; and a dielectric member disposed on the printed circuit board above the bias feed line;

wherein a high impedance of the bias feed line is maintained at a first frequency band, while a low impedance is produced at a second frequency band.

9. An RF circuit as recited in claim 7, wherein the RF circuit includes an RF amplifier.

10. An RF circuit as recited in claim 7, wherein the dielectric member is arranged to cover the bias feed line.

11. An RF circuit as recited in claim 7, wherein the dielectric member includes a capacitor.

12. An RF circuit as recited in claim 7, wherein the dielectric member is electrically coupled to an AC ground potential.

13. An RF circuit as recited in claim 7, wherein:

the RF circuit is operable on an RF signal having a carrier, the carrier having a predetermined wavelength;

the printed circuit board is made of material having a first dielectric constant;

the dielectric member is made of a material having a second dielectric constant;

the bias feed line has a physical length and an effective length, the effective length being related to the physical length and to the first and second dielectric constants; and the physical length and the first and second dielectric constants have values such that the effective length is one quarter of the predetermined wavelength of the carrier.

14. An RF circuit as recited in claim 8, wherein the RF circuit includes an RF amplifier.

15. An RF circuit as recited in claim 8, wherein the dielectric member is arranged to cover the bias feed line.

16. An RF circuit as recited in claim 8, wherein the dielectric member includes a capacitor.

17. An RF circuit as recited in claim 8, wherein the dielectric member is, electrically coupled to an AC ground potential.

18. An RF circuit as recited in claim 8, wherein:

the RF circuit is operable on an RF signal having a carrier, the carrier having a predetermined wavelength;

the printed circuit board is made of material having a first dielectric constant;

the dielectric member is made of a material having a second dielectric constant;

the bias feed line has a physical length and an effective length, the effective length being related to the physical length and to the first and second dielectric constants; and the physical length and the first and second dielectric constants have values such that the effective length is one quarter of the predetermined wavelength of the carrier.

* * * * *